United States Patent
Gomm

(10) Patent No.: US 7,259,604 B2
(45) Date of Patent: Aug. 21, 2007

(54) INITIALIZATION SCHEME FOR A REDUCED-FREQUENCY, FIFTY PERCENT DUTY CYCLE CORRECTOR

(75) Inventor: Tyler Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 198 days.

(21) Appl. No.: 11/196,581

(22) Filed: Aug. 3, 2005

(65) Prior Publication Data
US 2007/0030754 A1 Feb. 8, 2007

(51) Int. Cl.
*H03K 3/17* (2006.01)
(52) U.S. Cl. .......................... 327/175; 327/41; 327/158
(58) Field of Classification Search ................ None
See application file for complete search history.

(56) References Cited
U.S. PATENT DOCUMENTS

| | | | | |
|---|---|---|---|---|
| 4,559,505 A * | 12/1985 | Suarez et al. | ................ | 331/1 A |
| 5,892,407 A * | 4/1999 | Ishii | ............................. | 331/17 |
| 6,828,835 B2 * | 12/2004 | Cho | ............................. | 327/158 |
| 6,876,185 B2 * | 4/2005 | Niratsuka | ................ | 324/76.53 |
| 7,158,443 B2 * | 1/2007 | Lin | ............................. | 365/233 |

OTHER PUBLICATIONS

Tatsuya Matano, et al., A 1-Gb/s/pin 512-Mb DDRII SDRAM Using a Digital DLL and a Slew-Rate-Controlled Output Buffer, IEEE Journal of Solid-State Ciruicts, vol. 38, No. 5, May 2003.

* cited by examiner

*Primary Examiner*—Kenneth B. Wells
*Assistant Examiner*—An T. Luu
(74) *Attorney, Agent, or Firm*—Jones Day; Edward L. Pencoske

(57) ABSTRACT

A reduced-frequency, 50% duty cycle corrector (DCC) circuit may be used in an electronic device (e.g., a memory chip) to generate output clocks with 50% duty cycle irrespective of the duty cycle of the clock input to the DCC circuit. A DCC initialization scheme selectively activates the frequency division and edge detection operations in the DCC based on the lock status of the DCC during initialization. Upon initialization, the frequency division and edge detection operations are turned off or disabled. After the DCC is properly locked, these operations are enabled to obtain the 50% duty cycle output clock. This approach initializes the reduced-frequency DCC without output glitches, which can affect locking of a DLL with which the DCC may be used. The prevention of instability in locking of the DCC and DLL upon system initialization results in swift establishment of DCC and DLL locks without significant power consumption or loss of clock cycles. Once the DCC is locked during its initialization, the reduced-frequency operation of DCC further saves current consumption. Because of the rules governing abstracts, this abstract should not be used to construe the claims.

42 Claims, 8 Drawing Sheets

INITIALIZATION SCHEME FOR A REDUCED-FREQUENCY, FIFTY PERCENT DUTY CYCLE CORRECTOR

BACKGROUND

1. Field of the Disclosure

The present disclosure generally relates to duty cycle corrector (DCC) circuits and, more particularly, to a DCC initialization scheme for a reduced-frequency, 50% DCC.

2. Brief Description of Related Art

Most digital logic implemented on integrated circuits is clocked synchronous sequential logic. In electronic devices such as synchronous dynamic random access memory circuits (SDRAMs), microprocessors, digital signal processors, etc., the processing, storage, and retrieval of information is coordinated or synchronized with a clock signal. The speed and stability of the clock signal determines to a large extent the data rate at which a circuit can function. Many high speed integrated circuit devices, such as SDRAMs, microprocessors, etc., rely upon clock signals to control the flow of commands, data, addresses, etc., into, through and out of the devices.

In SDRAMs or other semiconductor memory devices, it is desirable to have the data output from the memory synchronized with the system clock that also serves the microprocessor. Delay-locked loops (DLLs) are synchronous circuits used in SDRAMs to synchronize an external clock (e.g., the system clock serving a microprocessor) and an internal clock (e.g., the clock used internally within the SDRAM to perform data read/write operations on various memory cells) with each other. Typically, a DLL is a feedback circuit that operates to feed back a phase difference-related signal to control a delay line, until the timing of one clock signal (e.g., the system clock) is advanced or delayed until its rising edge is coincident (or "locked") with the rising edge of a second clock signal (e.g., the memory internal clock). The second clock signal may be supplied directly or through a duty cycle corrector (DCC) to various circuit components in the electronic device. In a memory device, for example, a 50% DCC circuit may be employed so as to more proportionately spread out data transfer windows, especially when data transfer takes place on both the rising and falling edges of the memory's clock. In case when the memory's clock (e.g., clock output from a DLL (not shown)) has 25% duty cycle, the data transfer window at the rising edge of the clock may be shorter than the window at the falling edge of the clock because of a disproportionate gap between the successive rising and falling edges of the clock. In the event that data transfers are performed with a 50% duty cycle clock, such imbalance may be avoided by having one data transfer window occurring at the rising edge of the 50% duty cycle clock and the second data transfer window occurring at the second rising edge in the same clock cycle of the 50% duty cycle clock.

FIG. 1 depicts a simplified block diagram of a prior art duty cycle corrector (DCC) circuit 10 that may be used in an electronic device (e.g., a memory device) to provide clocks of various phases (signals 19, 20, and 22 in FIG. 1) from an input clock signal 18. More specifically, the DCC circuit 10 may be used to obtain a clock that is exactly 180° out of phase with the input clock 18. A 50% duty cycle clock may then be obtained using such 180° out of phase clock (e.g., the output clock 22 in FIG. 1) as is known in the art. The DCC circuit 10 may be a phase generator configured to generate clocks of various phases. The phase generator 10 may include a pair of series-connected delay lines 12, 14, and a phase detector 16 forming a feedback loop. The input clock (Clock In) signal 18 may be received from a DLL (not shown in FIG. 1, but shown in FIG. 2 and discussed later hereinbelow) and supplied as an input to the first delay line 12 and also as an input to the phase detector 16. One of the outputs of the circuit 10 may be obtained directly from the Clock In signal 18 as a first output clock or Clock Out 0° signal 19. It is evident from FIG. 1 that there is no phase difference (0° of phase difference) between the input clock 18 and the first output clock 19. The second output of the phase generator 10 may be obtained from the output of the first delay line 12 as indicated by the Clock Out 180° signal 22 in FIG. 1. As the name for this second output suggests, the phase difference between the input clock 18 and the Clock Out 180° signal 22 is 180°. Whereas a third output of the phase generator 10 may be obtained at the output of the second delay line 14. This third output, the Clock Out 360° signal 20 in FIG. 1, has a 360° phase difference (i.e., delayed by one full clock cycle) from the input clock 18.

It is seen from FIG. 1 that the output 20 of the second delay line 14 is fed back as the second input to the phase detector 16, which, as is known in the art, compares the phase difference between its two inputs—the Clock In signal 18, and the Clock Out 360° signal 20—and generates a control signal 24 (which is supplied to both the delay lines 12, 14) to control the delays imparted by the delay lines 12, 14 so as to ensure that the loop delay (i.e., the delay between the input signal (Clock In 18) and the feedback signal (Clock Out 360° signal 20)) is exactly one clock cycle ($1*t_{CK}$, where $t_{CK}$ is the input clock period). The two delay lines 12, 14 have the same control bits and, therefore, they impart same delay to their respective input clocks in response to the control signal 24. Because these two, matched delay lines divide the input clock 18 exactly into two portions, the "midpoint" clock (i.e., the output of the first delay line 12) is always 180° out of phase with the input clock 18 regardless of the input clock period or PVT (process, voltage, and temperature) variations. Thus, a 180° phase clock (the output signal 22 in FIG. 1) may be created using the topology of the phase generator 10. This topology may be expanded, as is known in the art, to arbitrary, multiphase clock generators (e.g., quadrature phase clock, etc.).

FIG. 2 shows a prior art circuit configuration 25 illustrating how a 50% DCC unit 26 is used in an electronic device. As noted hereinabove, a 50% duty cycle correction may be accomplished using the phase generator 10 along with appropriate logic circuits (not shown). However, a dedicated DCC that generates 50% duty cycle output(s) may be preferable in certain circuit configurations. The 50% DCC circuit 26 in FIG. 2 is one such dedicated DCC. As shown in FIG. 2, the 50% DCC 26 may be used in conjunction with a DLL 28. The DLL 28 provides synchronization between an external reference clock 30 and a device's internal clock (e.g., a clock that is used to perform various signal processing tasks within an electronic device or a memory chip). The external clock 30 may be typically the external system clock serving the microprocessor (and other system components present in the system along with the electronic device containing the DLL 28) or a delayed/buffered version of it. The system clock 30 may be supplied to the DLL 28 via one or more clock buffers (not shown). The other input to the DLL 28 may be supplied through the feedback loop that includes an I/O delay model 34, which receives the Clock Out 0° signal 19 at one of the outputs of the 50% DCC 26 and provides an appropriately delayed version of the output signal 19 (here, the feedback clock 36) to a phase detector (not shown) in the DLL 28 for phase comparison and clock synchronization. The I/O delay model 34 may function as a buffer or dummy delay circuit so that the output 36 ("the feedback clock") of the delay model 34 may effectively represent the internal clock that is provided to various circuit elements in the electronic device (e.g., a memory device) (not shown) containing the circuit configuration 25. Thus, the I/O delay model 34 attempts to maintain the phase relationship between the external clock 30 and the signal 36 as close as possible to the phase relationship that exists between the external clock 30 and the electronic device's (e.g., a memory's) internal clock, which, in FIG. 2, is one of the Clock Out 0° 19 or Clock Out 180° 22 signals.

It is noted here that for the sake of simplicity and ease of discussion, signals or circuit elements having similar functionality are referred to herein using identical reference numerals even though these signals or circuit elements may not be physically identical from one configuration to another. Thus, for example, the DLL Clock Out signal is given the same reference numeral "18"' as that given to the Clock In signal in FIG. 1 (and FIG. 3) because both of these signals function as inputs to a DCC (e.g., the phase generator 10 in FIG. 1, and the DCC 26 in FIGS. 2-3). Thus, a clock signal input to a DCC is referenced using the reference numeral "18" irrespective of the shape or duty cycle of the input clock. That is, the Clock In signal 18 in FIG. 1 and the DLL Clock Out signal 18 in FIG. 2 may not have identical shape or duty cycle, even though they have the same reference numeral. Similarly, for ease of discussion, all output clocks (e.g., Clock Out 0° signal 19, Clock Out 180° signal 22, etc.) from a DCC (whether a simple phase generator as in FIG. 1 or a dedicated 50% DCC as in FIGS. 2-3) are referred to herein using the same reference numerals despite the fact that these clocks may not be physically identical. Various common circuit elements (e.g., delay lines, phase detector, etc.) having similar functionality in different embodiments discussed herein are also referred to using identical reference numerals. As noted, the usage of same reference numerals for various DCC circuit elements and input/output clocks is preferred for ease of discussion only. It is further observed here that the additional mention of "50%" may be absent from the usage of the term "DCC" hereinbelow, but, it should be apparent from the context of discussion whether the term "DCC" refers to a "50% DCC" or any other form of DCC (e.g., the phase generator 10).

The DLL 28 may generate two output signals—the DLL Clock Out signal 18 and the DLL Lock Signal 32—both of which may be supplied as inputs to the 50% DCC 26. The DLL Clock Out signal 18 may be a phase synchronized version of the external clock 30, whereas the DLL Lock signal 32 may provide an indication to the DCC 26 when the DLL 28 is "locked" (e.g., when the rising edge of the system clock 30 is coincident with the rising edge of the feedback clock 36). The DLL Lock signal 32 may thus allow the DCC 26 to establish its own "lock" (discussed later hereinbelow). The DCC 26 corrects for any static duty-cycle problem in its input reference clock (i.e., the DLL output clock 18) and generates two output clocks—the Clock Out 0° signal 19, and the Clock Out 180° signal 22 having 0° and 180° phase differences, respectively, from the DCC input clock (i.e., the DLL Clock Out signal 18). Each of these two output clocks 19, 22, has a 50% duty cycle as the name "50% DCC" suggests.

FIG. 3 illustrates a detailed block diagram layout for the 50% DCC unit 26 of FIG. 2. As shown, the configuration of the DCC unit 26 is significantly similar to the phase generator 10 in FIG. 1, except for two changes that result in generation of output clocks with 50% duty cycles from an input clock of any other duty cycle. First, the Clock In signal 18 (input clock to DCC 26 from DLL 28 in FIG. 2) is not directly supplied to the first delay line 12 as in FIG. 1, but through a clock frequency divider unit 38. Thus, the input clock is supplied to the divide-by-2 frequency divider 38 that divides the input clock frequency by two. The output 40 (also designated by circled letter "A") of this frequency divider 38 is then supplied as an input to the phase detector 16, an input to the first delay line 12, and also as an input to a clock edge detector unit 42. Second, the output clocks 19, 22 are generated through the clock edge detector 42 instead of directly from the input clock 18 and the output from the first delay line 12 as was the case in FIG. 1. Thus, the output 44 (also designated by circled letter "C") of the first delay line 12 is supplied as a second input of the edge detector unit 42, which performs clock edge detection (here, a logic XOR or "exclusive OR" function) on the two input clocks 40, 44 to generate the 50% duty cycle output clocks 19, 22. The rest of the circuit elements and signals in FIG. 3 are identical to those shown in FIG. 1 and, hence, additional discussion thereof is not provided herein for the sake of brevity. It is, however, noted here that the Clock Out 360° signal 20 at the output of the second delay line 14 is conveniently referenced using a circled letter "B." Furthermore, only one of the DLL outputs from FIG. 2—the DLL Clock Out signal 18—is shown in FIG. 3 (as the Clock In signal 18), because of lack of relevance of the second output (i.e., the DLL Lock signal 32) with the present discussion. It is evident, however, that such DLL Lock signal 32 may be present as an input to the DCC unit 26 in a real life implementation.

Thus, in the configuration of FIG. 3, the incoming clock frequency is divided by two before the clock enters the delay loop of the DCC 26. Therefore, instead of attempting to lock rising edges of two phase detector input clocks as was the case in the configuration 10 of FIG. 1, the phase detector 16 in FIG. 3 is modified to lock the rising edge of the feedback clock 20 (circled letter "B") to the falling edge of its reference clock input (i.e., the clock signal 40 or circled letter "A" signal input to the phase detector 16) and vice versa. The intermediate output clocks 40, 44 are multiplied back up to the original frequency using edge detection through the edge detector unit 42 which performs XOR operation on its input clocks 40, 44 to obtain the final 50% duty cycle outputs 19, 22. In FIG. 3, both the rising and falling edges of the clock 40 are used (in phase detector 16, in delay line 12, and in XOR unit 42) to generate the final outputs 19, 22. Therefore, it is assumed that the delay lines 12, 14 preserve proper duty cycle of their respective input clocks so as to allow such dual-edge operation.

FIG. 4 illustrates the operation of the 50% DCC unit 26 in FIG. 3 through a set of waveforms of various clock signals in the 50% DCC unit 26. The signals in FIG. 4 are identified by corresponding reference numerals of various input, intermediate, and output clock signals in FIG. 3. It is shown in FIG. 4 that the phase detector 16 is modified to lock the rising edge of its first input clock 20 to the falling edge of its second input clock 40, and vice versa (i.e., locking the falling edge of clock 20 to the rising edge of clock 40) because of the input clock frequency division at block 38 (which aligns rising edge of one clock to the falling edge of the another of the two clocks 20, 40 as shown in FIG. 4). The Clock Out 360° signal 20 (represented by circled letter "B") is still 360° out of phase with the input clock 18, but with half the frequency of the input clock 18. The "midpoint" delayed signal—i.e., the intermediate clock 44 (circled letter "C")—at the output of the first 12 of the two matched delay lines 12, 14 is a delayed version (wherein the delay is determined by the control input 24 from the phase detector 16 as discussed hereinbefore) of the clock 40, but is not exactly 180° out of phase with the input clock 18 as can be seen from FIG. 4. However, the final output signal Clock Out 180° signal 22 is exactly 180° out of phase with the input clock 18, but with 50% duty cycle. Similarly, the other final output signal 19 is exactly in phase (0° phase difference) with the input clock 18, but with its duty cycle corrected to 50%.

It is seen from the waveforms in FIG. 4 that because of frequency division at block 38 (FIG. 3), all internal clock frequencies (of clocks 40, 20, and 44) have been reduced in half, therefore also reducing DCC current consumption by half (resulting in power savings). This frequency reduction, however, allows the DCC 26 to operate at still faster frequencies (of the input clock 18 and, hence, of the external system clock 30 (FIG. 2)) because of the same-speed limitations of the internal circuitry in an electronic device (i.e., all internal circuits within an electronic device should be capable of operating at the same clock speed). As noted before, the output signals 19, 22 are not only in the correct phase (in phase or 180° out of phase, whichever is applicable), but the duty cycle of each output clock 19, 22 is nearly equal to 50%, which is not the case for the output clocks 19, 22 in a non-frequency-divided version of DCC (i.e., the phase generator 10 in FIG. 1). In the non-divided version 10, the phases of output clocks 19, 22 are correct (in phase or 180° out of phase, whichever is applicable) with reference to the input clock 18, but the duty cycle of each output clock 19-20, 22 is the same as the duty cycle of the input clock 18. On the other hand, the duty cycles of the input 18 and output clocks 19, 22 may be different in the DCC circuit 26 in FIG. 3 as can be seen from the relevant waveforms in FIG. 4. The DCC unit 26 is a dedicated 50% DCC because it achieves the desired 50% duty cycle correction in its output clocks 19, 22 without any further processing.

The waveforms in FIG. 4 show the reduced-frequency 50% DCC 26 operating properly after the DCC feedback loop (formed by the clocks 40 and 20) is "locked" (i.e., the rising edge of the feedback clock 20 is locked or synchronized to the falling edge of the reference clock 40, or vice versa). However, at the time of initialization of the DCC 26, the output clocks 19 and 22 are very close in phase (which is determined by the minimum, intrinsic delay for each forward delay line 12 and 14). During this initialization, the XOR or edge detection function in the unit 42 will produce narrow glitches or pulses, or may not produce any output clock signal at all. FIG. 5 shows a set of waveforms of various clock signals in the 50% DCC unit 26 of FIG. 3 at the time of initialization of DCC 26 and before the DCC is "locked" (i.e., before the DCC feedback loop signals 20 and 40 are phase synchronized as noted hereinbefore). The narrow glitches or pulses in the output clocks 19, 22 are evident in their corresponding waveforms in FIG. 5. It is observed here that this problem of narrow glitches only affects the multiplied output (i.e., outputs 19, 22 from the XOR unit 42), but does not affect the fed-back clock signal (i.e., the Clock Out 360° signal 20). Therefore, the DCC 26 will eventually begin to lock (because the phase detector inputs 20, 40 are not affected by the multiplication operation in the XOR unit 42), and the pulses in the final outputs 19, 22 will start getting wider until they are at 50% duty cycle and the DCC loop is locked.

It is seen from FIG. 2 that the DCC 26 is placed after the DLL 28 in the signal propagation path (i.e., DCC 26 is in the forward-path delay of the system). In that situation, to ensure proper/careful initialization of DLL 28 and DCC 26, the following initialization sequence is used: (1) First, the DLL 28 is initialized and locked, and (2) once the DLL is locked and enters the quiescent state (as indicated by the assertion of the DLL Lock Signal 32 in FIG. 2), the DCC 26 is then allowed to lock (based on the status of the DLL Lock signal 32). In this sequential locking mechanism and because DCC 26 is in the forward-path delay of the system, if the clocks are lost because of the narrow pulse width upon DCC initialization (as shown by the narrow pulses in the waveforms for output clocks 19, 22 in FIG. 5), there may be no clock fed back to the DLL 28 because the glitches in the DCC output clock 19, which is fed back to DLL 28 as shown in FIG. 2, may collapse in the DLL feedback path (through the I/O delay model 34 shown in FIG. 2). In that case, the DLL 28 may lose its initial lock or cannot maintain it and, hence, may itself never initialize and may not allow DCC 26 to lock either. Such instability in establishing DLL and DCC locks may consume significant system time (in terms of many, wasted clock cycles of the system clock 30) and power before both of these components are locked, if at all.

It is therefore desirable to devise an initialization scheme for reduced frequency (obtained using input clock frequency division as discussed hereinbefore), 50% DCC that prevents the instability (noted above) in locking the DCC and DLL upon system initialization. It is also desirable that this initialization scheme for the 50% DCC be able to initialize swiftly, and properly lock the DCC (and DLL) without significant power consumption.

SUMMARY

In one embodiment, the present disclosure contemplates a method of operating a clock duty cycle corrector (DCC). The method comprises receiving an input clock and generating an output clock from the input clock upon commencement of an initialization of the DCC, wherein the output clock has a first duty cycle that is identical to the duty cycle of the input clock. The method also comprises switching the duty cycle of the output clock from the first duty cycle to a second duty cycle once the DCC is locked during the initialization, wherein the second duty cycle is different from the first duty cycle.

In another embodiment, the present disclosure contemplates another method of operating a clock duty cycle corrector (DCC). The method comprises receiving an input clock having a fixed duty cycle and generating an output clock having a duty cycle identical to the duty cycle of the input clock until the DCC is locked during an initialization thereof. The method also comprises switching the duty cycle of the output clock to a duty cycle different from the duty cycle of the input clock once the DCC is locked during the initialization.

In a further embodiment, the present disclosure contemplates another method of operating the DCC. The method comprises receiving an input clock; monitoring a lock status of the DCC; and performing one of the following based on the lock status of the DCC: (1) generating an output clock having a duty cycle identical to the duty cycle of the input clock until the DCC is locked during an initialization thereof, or (2) generating the output clock having a duty cycle different from the duty cycle of the input clock once the DCC is locked during the initialization.

In another embodiment, the present disclosure contemplates a method, which comprises generating an output clock from an input clock and having a first duty cycle identical to the duty cycle of the input clock prior to occurrence of a triggering event; and switching the duty cycle of the output clock from the first duty cycle to a second duty cycle different from the first duty cycle upon occurrence of the triggering event.

In a still further embodiment, the present disclosure contemplates a circuit. The circuit comprises a frequency divider unit configured to receive an input clock and to generate a first intermediate clock therefrom, wherein the frequency divider unit is configured to be selectively activated and wherein the first intermediate clock is one of the following depending on the activation status of the frequency divider unit: (1) the input clock when the frequency divider unit is turned off, or (2) a frequency-divided version of the input clock when the frequency divider unit is turned on. The circuit further comprises a phase detector unit coupled to the frequency divider unit, wherein the phase detector unit receives the first intermediate clock and a second intermediate clock as inputs thereto and asserts a lock signal based on a relationship between the phases of the first and the second intermediate clocks. A divide enable unit in the circuit is coupled to the phase detector and the frequency divider units. The divide enable unit receives the lock signal from the phase detector and asserts an enable signal at an output thereof when the lock signal is asserted, wherein the frequency divider unit receives the enable signal and is configured to be turned on when the enable signal is asserted and to be turned off when the enable signal is de-asserted.

The circuit described in the preceding paragraph according to one embodiment of the present disclosure may be part of an electronic device including, for example, a memory device. Such memory devices may be used in various systems including, for example, computing or data processing systems. Such electronic devices and systems are also contemplated in various embodiments of the present disclosure.

The present disclosure describes a reduced-frequency, 50% duty cycle corrector (DCC) circuit that may be used in an electronic device (e.g., a memory chip) to generate output clocks with 50% duty cycle irrespective of the duty cycle of the clock input to the DCC circuit. A DCC initialization scheme according to one embodiment of the present disclosure selectively activates the frequency division and edge detection operations in the DCC based on the lock status of the DCC during initialization. Upon initialization, the frequency division and edge detection operations are turned off or disabled. After the DCC is properly locked, these operations are enabled to obtain the 50% duty cycle output clock. This approach initializes the reduced-frequency DCC without output glitches, which can affect locking of a DLL with which the DCC may be used. The prevention of instability in locking of the DCC and DLL upon system initialization results in swift establishment of DCC and DLL locks without significant power consumption or loss of clock cycles. Once the DCC is locked during its initialization, the reduced-frequency operation of DCC further saves current consumption.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to certain embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state memories or memory-based systems. It is noted at the outset that the terms "coupled," "connected", "connecting," "electrically connected," etc., are used interchangeably herein to generally refer to the condition of being electrically connected. It is further noted that various block diagrams, circuit diagrams and timing waveforms shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1").

Figure 1:
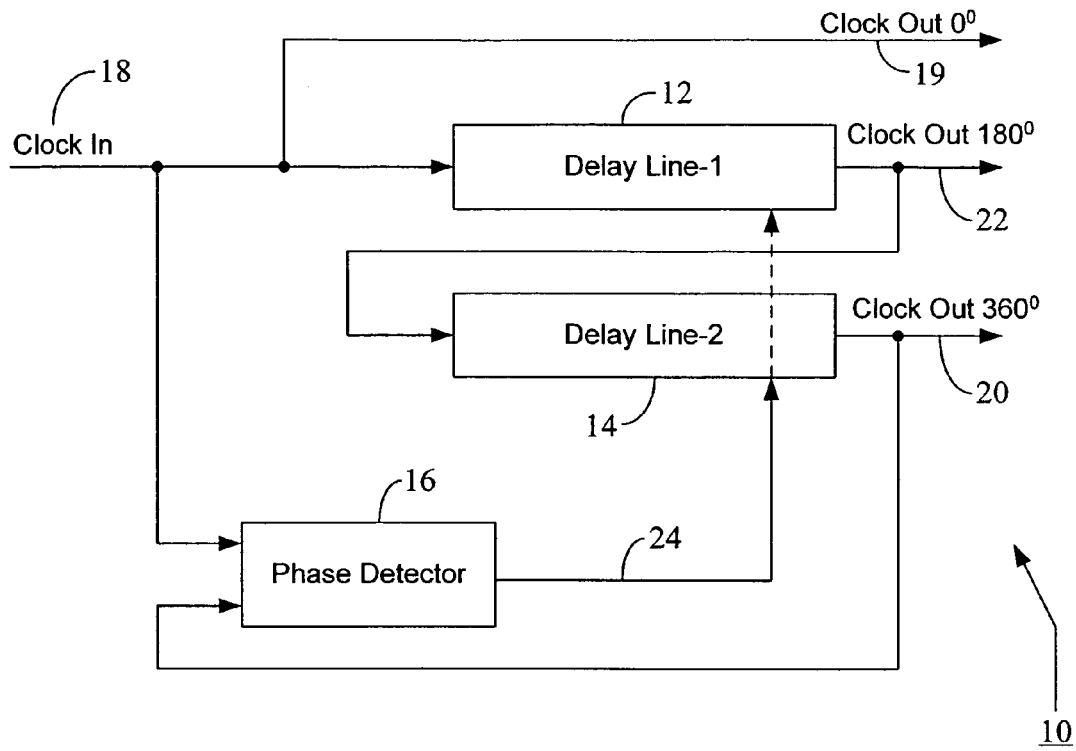
FIG. 1 depicts a simplified block diagram of a prior art duty cycle corrector (DCC) circuit that may be used in an electronic device (e.g., a memory device) to provide clocks of various phases from an input clock signal.
Figure 2:
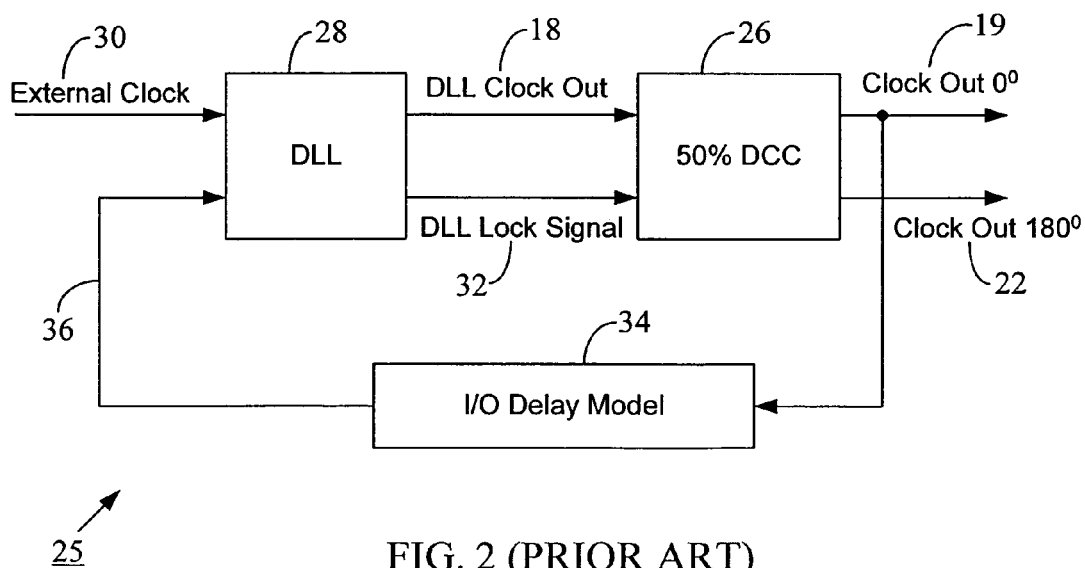
FIG. 2 shows a prior art circuit configuration illustrating how a 50% DCC unit is used in an electronic device.
Figure 6:
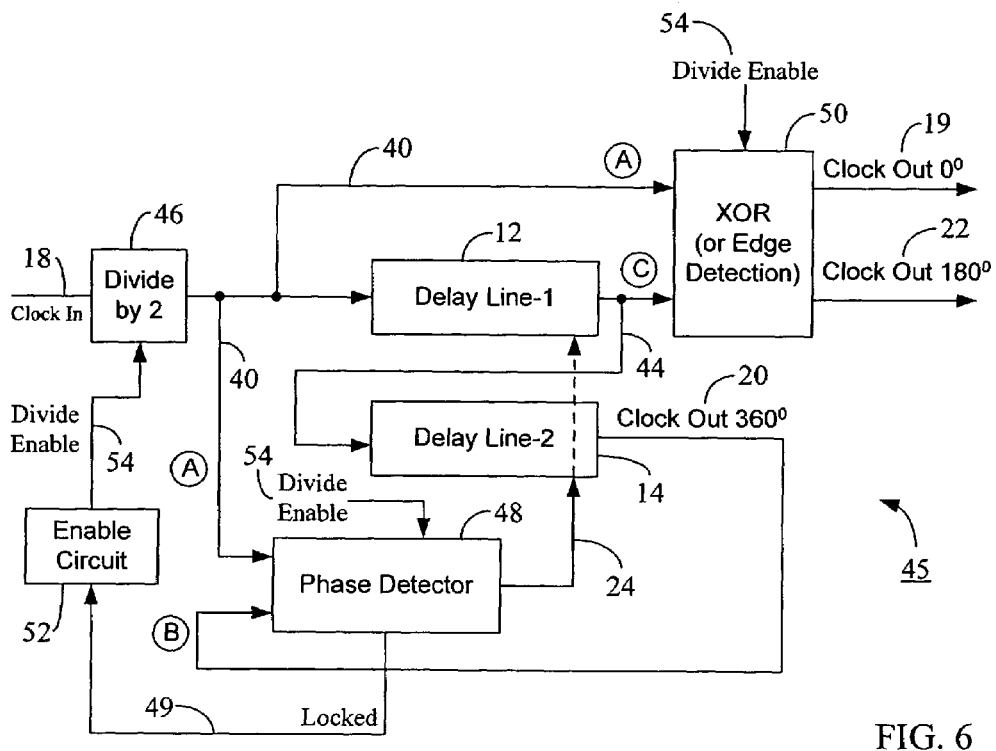
FIG. 6 depicts a detailed block diagram layout of a 50% DCC unit according to one embodiment of the present disclosure.

FIG. 6 depicts a detailed block diagram layout of a 50% DCC unit 45 according to one embodiment of the present disclosure. The DCC unit 45 may replace the prior art DCC 26 in FIG. 2 and, hence, may be used with a DLL in the same manner as the DCC 26 in FIG. 2. No additional modifications in the configuration of FIG. 2 may be needed when the DCC 26 is replaced with the DCC 45 according to one embodiment of the present disclosure. It is known in the art that a clock synchronization circuit (e.g., a DLL) is used for compensating a skew between an external clock signal and an internal clock signal for an electronic device, e.g., a memory device. Therefore, it is noted here that although the discussion below is given with reference to the DCC 45 that may be used in conjunction with a delay locked loop (DLL), that discussion may equally apply (with necessary circuit modifications known to one skilled in the art) to a clock synchronization circuit (not shown) employing a phase locked loop (PLL) instead of a DLL. Therefore, additional PLL-based embodiments are not discussed hereinbelow.

Figure 3:
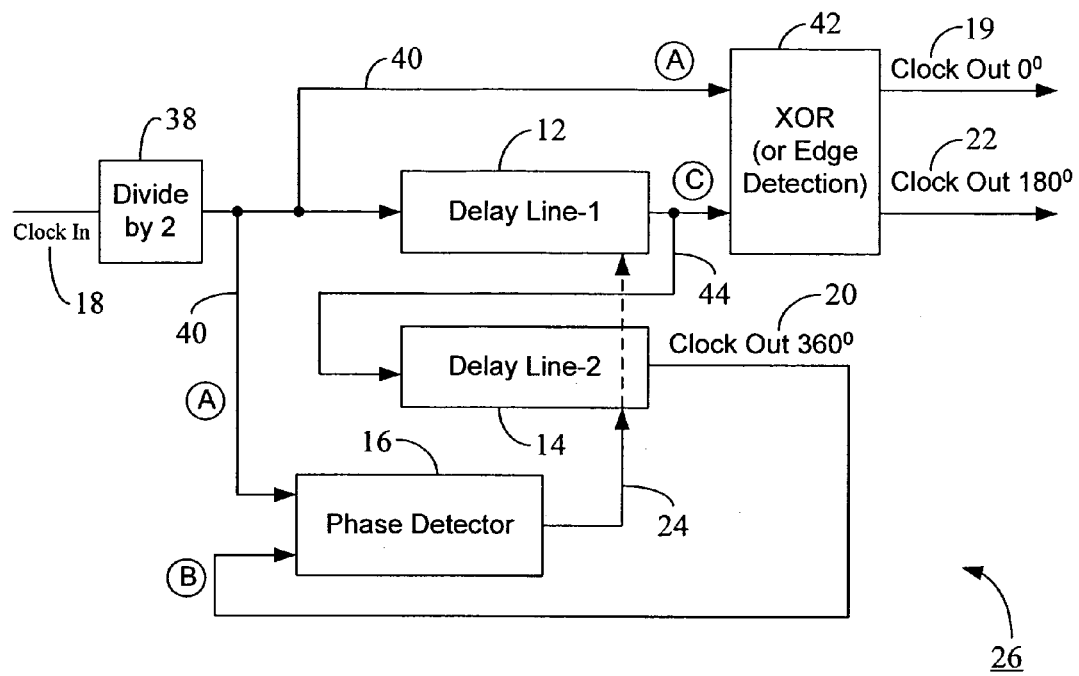
FIG. 3 illustrates a detailed block diagram layout for the 50% DCC unit of FIG. 2.

The 50% DCC unit 45 in FIG. 6 may be a modified version of the DCC unit 26 in FIG. 3 as can be seen from a comparison of FIGS. 3 and 6. In addition to the delay lines 12, 14, the DCC unit 45 may include a clock frequency divider unit 46, a phase detector 48, an edge detector unit 50, and a divide enable unit 52. In the embodiment of FIG. 6, the frequency divider unit 46 is configured to divide the frequency of the input clock 18 by two (2). As before, for ease of discussion, various signals (e.g., the Clock In signal 18, the Clock Out 0° signal 19, the intermediate clock signals indicated by circled letters "A", "B", and "C", etc.) in FIG. 6 are identified using the same reference numerals as those used for similarly-named signals in FIG. 3. As mentioned hereinbefore, such identical reference is for convenience and ease of discussion only; it does not imply, in any way, that the signals having identical reference numerals in FIGS. 3 and 6 have identical waveforms, duty cycles, frequency, etc.

The divide enable unit 52 is added to the circuit configuration of FIG. 3 to accomplish selective activation/deactivation of the divide-by-2 frequency divider 46 and the XOR edge detector 50. The enable unit 52 generates a divide enable signal 54, which may be supplied to the frequency divider 46 and the XOR unit 50 as shown in FIG. 6 to activate/deactivate these units in accordance with the assertion status of the enable signal 54. In one embodiment, the divide enable signal 54 is considered "asserted" when it goes to a logic "1" level or "high" state from its "de-asserted" state of logic "0" or "low" level. The enable circuit 52 is configured to assert the divide enable signal 54 in response to a "triggering event." In the embodiment of FIG. 6, the triggering event is the establishment of a "locked" status for the DCC 45 during its initialization. Such "locked" condition may be indicated by the phase detector 48 by generating a DCC-locked signal 49, which, in turn, is supplied as a "trigger input" to the divide enable unit 52. When the DCC 45 is locked (as detected by the phase detector 48 upon establishment of a specific phase relationship between the phase detector input clocks 20 and 40) during its initialization, the phase detector 48 may assert the DCC-locked signal 49 which, in turn, may result in the assertion of the divide enable signal 54 by the enable unit 52.

Figure 5:
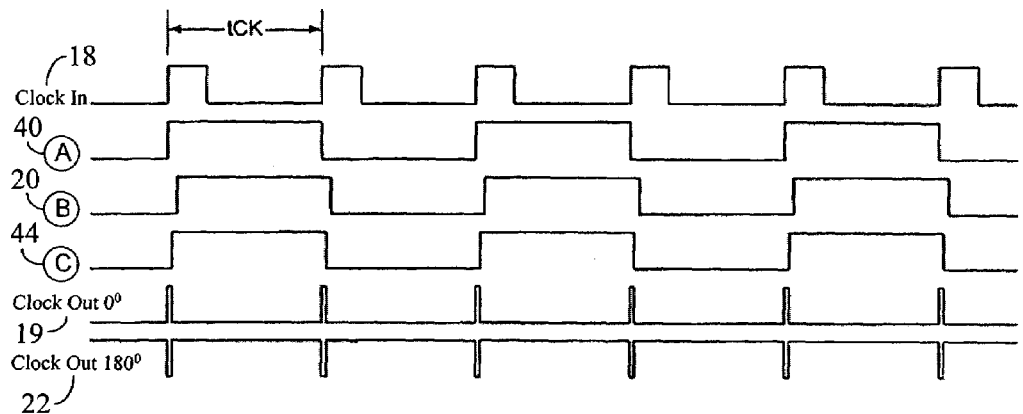
FIG. 5 shows a set of waveforms of various clock signals in the 50% DCC unit of FIG. 3 at the time of initialization of DCC and before the DCC is "locked"

During initialization of the DCC 45, the enable signal 54 is used to control frequency division and edge detection operations in units 46 and 50, respectively, to ensure that DCC 45 outputs proper clock signals 19, 22 (as opposed to the clocks with glitches as shown in the waveforms for clocks 19 and 22 in FIG. 5) even when not fully initialized. Therefore, upon initialization of the DCC 45, the divide enable signal 54 remains de-asserted, thereby disabling the divide-by-two and XOR (edge detection) operations because a de-asserted enable signal 54 disables the frequency divider and edge detector units 46 and 50, respectively. After the DCC 45 is properly locked during its initialization phase, the phase detector 48 asserts the DCC-locked signal 49 which, in turn, enables the divide enable unit 52 to assert the divide enable signal 54. The assertion of the divide enable signal 54 after the DCC 45 is properly locked results in activation of the frequency divider 46 and XOR 50 units, providing the desired power savings as discussed later hereinbelow with reference to FIG. 7.

Figure 4:
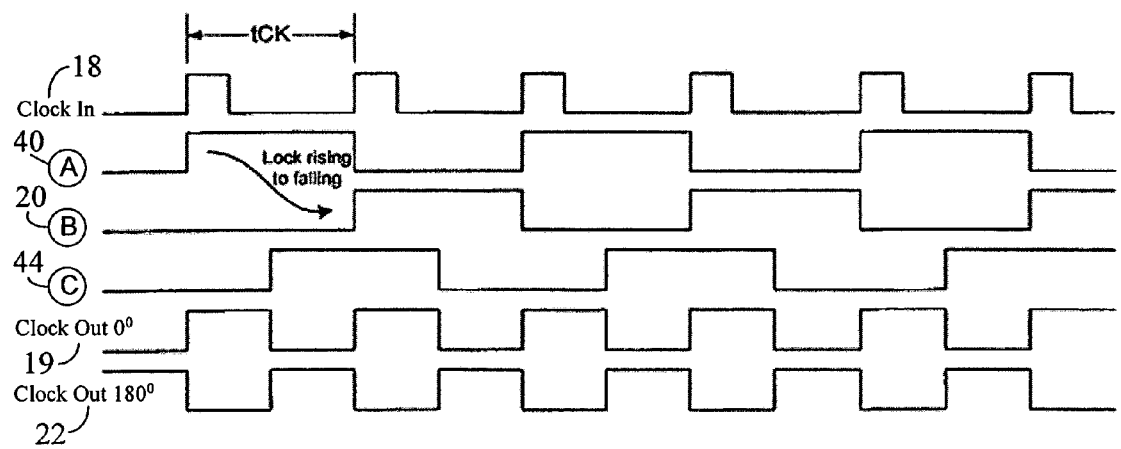
FIG. 4 illustrates the operation of the 50% DCC unit in FIG. 3 through a set of waveforms of various clock signals in the 50% DCC unit.

Such selective activation of frequency division and edge detection (signal multiplication) operations without affecting the lock status of the DLL (e.g., the DLL 28 in FIG. 2 operating in conjunction with the DCC 45) or generating timing distortions in the output clocks 19, 22 may be possible because it is observed that the physical lock point (in the delay lines 12, 14 and as controlled by the delay control signal 24 from the phase detector 48) for the non-divided clock (i.e., when the frequency divider unit 46 is turned off by de-assertion of the divide enable signal 54) may be exactly the same as that for the divided clock (i.e., when the frequency divider 46 is turned on by assertion of the divide enable signal 54). In the non-divided clock situation, the phase detector 48 may lock the rising edge of the clock signal 40 to the rising edge of the feedback clock 20. However, in the divided clock situation, the assertion of the divide enable signal 54 (which is also input to the phase detector 48 as shown in FIG. 6) may control the phase detector 48 locking behavior so that the phase detector 48 now locks the rising edge of the feedback clock 20 to the falling edge of the clock signal 40 similar to such locking illustrated and discussed hereinabove with reference to FIG. 4. Thus, the switching of the phase detector 48 locking in case of divided-clock inputs results in a DCC locking behavior that is similar to the prior art DCC locking behavior (rising-to-falling edge locking) illustrated in FIG. 4 and, hence, the DCC 45 of FIG. 6 may be used in place of the DCC 26 in FIG. 2 without any circuit modifications to supply the 50% duty cycle outputs 19, 22 similar to those shown in FIG. 4 (and also shown hereinbelow in FIG. 7).

It is noted here that the delay lines 12, 14 in FIG. 6 may operate in a series-connected coarse and fine delay lines. For example, in one embodiment, the delay line 12 may be comprised of series connected fine and coarse delay lines, with delay line 14 also comprised of similar fine—coarse delay lines. The operation of the enable unit 52 is discussed hereinabove. The remaining circuit elements in FIG. 6 (including the frequency divider 46, phase detector 48, and the XOR unit 50) serve the same purpose as that served by similar elements in the configuration of FIG. 3, except for the controlled activation of frequency division and edge detection operations based on DCC 45 lock status during its initialization phase. Various clocks signals in FIG. 6 are also generated in the same manner as that discussed hereinbefore with reference to FIGS. 3-4. Therefore, additional discussion of the operation and functionality of the DCC 45 in FIG. 6 is omitted herein for the sake of brevity. It is, however, pointed out that a brief discussion of operation of DCC 45 and generation of various clock signals during initialization of DCC 45 is given hereinbelow with reference to the exemplary clock waveforms in FIG. 7.

Figure 7:
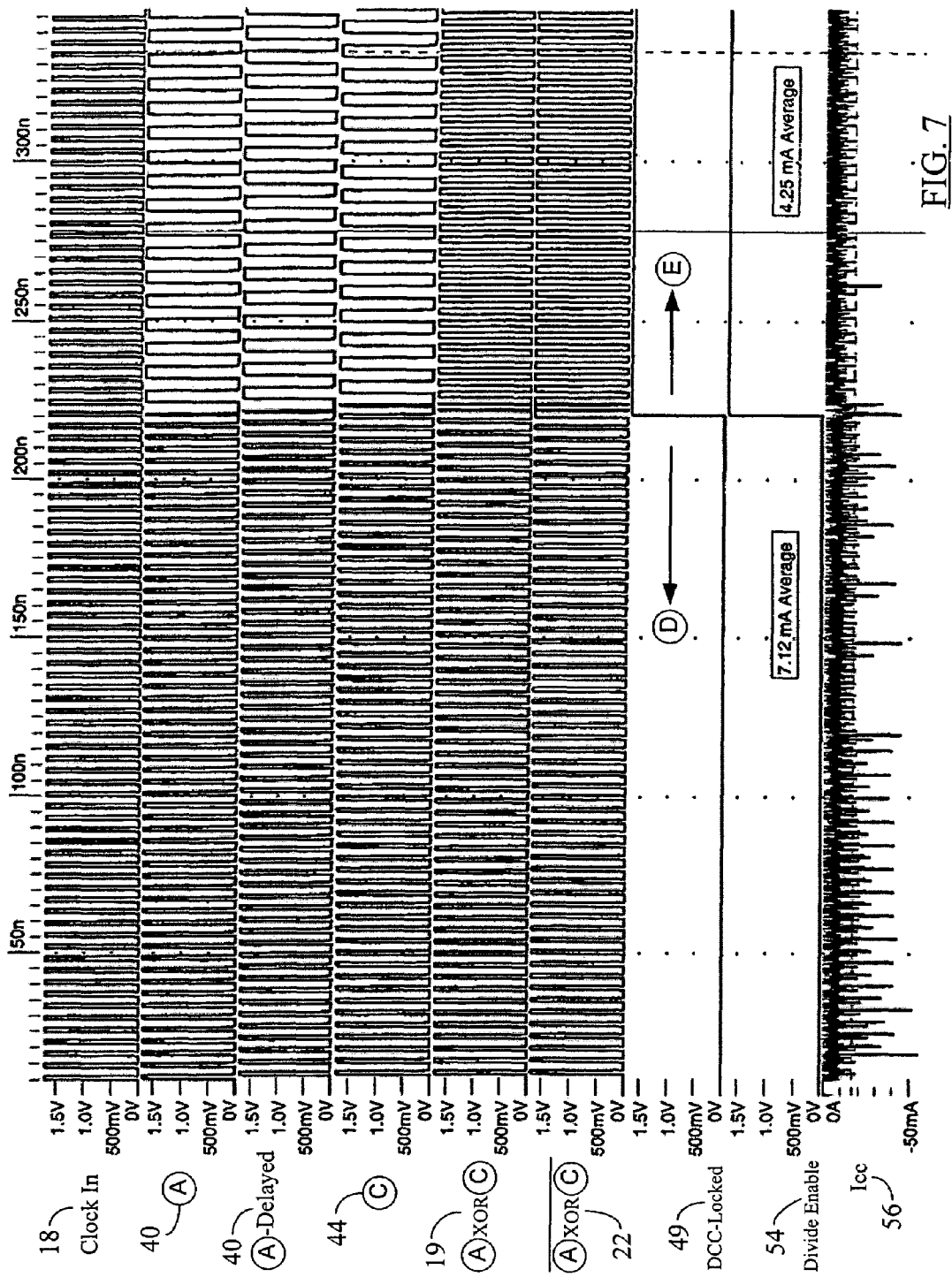
FIG. 7 shows an exemplary set of simulated waveforms illustrating the operation of the 50% DCC in FIG. 6 upon initialization according to one embodiment of the present disclosure.

FIG. 7 shows an exemplary set of simulated waveforms illustrating the operation of the 50% DCC 45 in FIG. 6 upon initialization according to one embodiment of the present disclosure. The top most waveform in FIG. 7 is the input clock signal 18, followed by two clock waveforms—the first one of them is the clock designated by the circled letter "A" and the second one is the clock that is a delayed version of the clock designated by the circled letter "A". It is observed here that although the one of the input clock to the XOR 50 and phase detector 48 is identified by the circled letter "A" and given the reference numeral "40," in a practical implementation of the circuit 45, one of the clocks 40 may be a slightly delayed version of the other clock 40 because of different internal circuit delays encountered by the output of the frequency divider 46 (which output is fed to the XOR unit 50 and phase detector 48 as shown in FIG. 6). However, for ease of discussion, such different internal circuit delay has been ignored in the block diagram in FIG. 6 and, hence, the common input to the XOR unit 50 and phase detector 48 is represented by a single reference numeral "40." In one embodiment, the clock 40 to the phase detector may be a slightly delayed version of the clock 40 input to the XOR unit 50. In another embodiment, the XOR clock input 40 may be a slightly delayed version of the phase detector clock input 40 depending on the circuit configuration. Such delayed version of clock 40 (circled letter "A") is also shown in FIG. 7 for reference. Other signals in FIG. 7 include the second input 44 of the XOR unit 50 (denoted by the circled letter "C"), the two DCC output clocks 19, 22 from the XOR unit 50, the DCC-locked signal 49 generated by the phase detector 48, and the divide enable signal 54 output from the enable unit 52. A plot of DCC circuit 45 current (Icc 56) through the supply voltage (Vcc) is also shown in FIG. 7 to illustrate the current savings in the DCC 45 of FIG. 6 as explained below.

As discussed hereinabove, the DCC 45 of FIG. 6 is configured to turn off the frequency division and edge detection operations upon initialization thereof. These operations are turned on once the DCC 45 is "locked" as determined by the phase detector 48 and indicated by asserting the DCC-locked signal 49. This switching of frequency division and edge detection operations is illustrated in FIG. 7 by assertion of the DCC-locked signal 49 (going high at the boundary of regions indicated by circled letters "D" and "E" in FIG. 7). It is seen from FIG. 7 that before the DCC-locked signal 49 is asserted (i.e., the region identified by the circled letter "D"), output clocks 19, 22 have the same pulse width, frequency, and duty cycle as the input clock 18 because of turning off of the frequency divider 46 upon initialization of the DCC 45. Further, because the XOR unit 50 is also turned off upon DCC initialization (the region of circled letter "D" in FIG. 7), both of the output clocks 19 and 22 have identical waveforms and phase.

However, once the DCC-locked signal 49 is asserted, the divide enable signal 54 is also asserted as can be seen from the logic "high" or "1" levels for the waveforms of these signals in FIG. 7 at the boundary of regions marked by circled letters "D" and "E". Once the divide enable signal 54 is asserted, the frequency division and edge detection operations are activated because their respective circuit units 46 and 50 are turned on by the divide enable signal 54. The region marked by circled letter "E" in FIG. 7 indicates the operation of DCC 45 after it is locked during its initialization phase. Once the frequency divider unit 46 is turned on (by the assertion of the divide enable signal 54), the frequency and duty cycle of clocks 40 and 44 (obtained from the output of the frequency divider 46) change from the frequency and duty cycle of the input clock 18. In the embodiment of FIG. 7, the frequency divider 46 is a divide-by-2 unit and, hence, the frequency of clocks 40, 44 is half the frequency of the input clock 18 and duty cycle of clocks 40, 44 is 50% (which is different from about 30% duty cycle of the input clock 18). The duty cycle of the clock 40 (and, hence, clock 44) output from the frequency divider 46 may be fixed or predetermined, and may not depend on the duty cycle of the input clock 18. The switch (due to the assertion of the divide enable signal 54) in the frequency and duty cycle of the clocks 40, 44 input to the XOR unit 50 result in the switch in the duty cycle of the output clocks 19, 22. As seen from FIG. 7, after the DCC lock status is established, the frequency of the output clocks 19, 22 remains equal to the frequency of the input clock 18, but their duty cycle switches from the duty cycle of the input clock 18 (in the region marked by circled letter "D") to a duty cycle that is equal to the duty cycle (here, 50%) of the intermediate clocks 40, 44. Thus, the 50% DCC 45 continues outputting clocks 19, 22 with frequency equal to the input clock 18, but now with the desired 50% duty cycle for current savings as discussed hereinbelow.

As noted hereinabove, the frequency of intermediate clocks 40, 44 is reduced in half by activation of the frequency divider 46, thereby resulting in reduced internal frequencies of operation in the DCC 45. Such reduction in frequency saves power consumption as can be seen from a comparison of current (Icc) consumption plot 56 in FIG. 7 before and after the frequency divider 46 is switched on. In the embodiment of FIG. 7, the average current consumption in the DCC 45 while it is operating in the region marked by circled letter "D" is 7.12 mA, but that average current consumption reduces to 4.25 mA once the frequency divider 46 and XOR unit 50 are turned on and DCC 45 starts operating in the region marked by circled letter "E."

Figure 8:
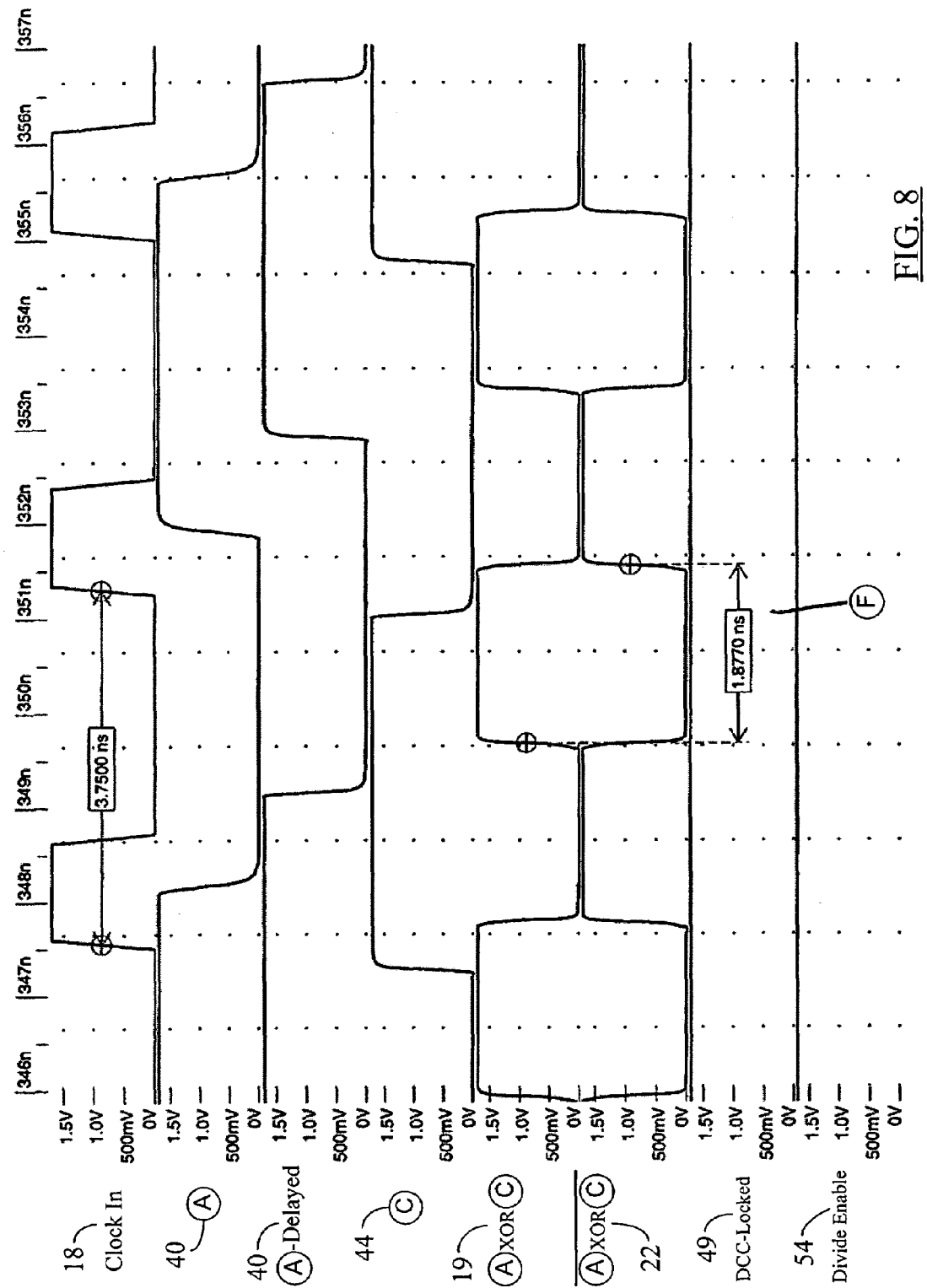
FIG. 8 shows a close up view of various clocks and other control signal waveforms in the region marked with circled letter "E" in FIG. 7.

FIG. 8 shows a close up view of various clocks and other control signal waveforms in the region marked with circled letter "E" in FIG. 7. In the embodiment of FIGS. 7-8, the clock period ($t_{CK}$) of the input clock 18 is equal to 3.75 ns as shown more clearly in FIG. 8. In FIG. 8, the DCC-locked 49 signal and, hence, the divide enable signal 54 are shown asserted (i.e., in logic "high" or "1" state) because of the operation of DCC 45 in the region marked with circled letter "E" in FIG. 7. Therefore, the frequency division and clock multiplication (XOR) operations are turned on in DCC 45. This results in generation of output clocks 19, 22 with $t_{CK}$ equal to 3.75 ns (input clock period), but with 50% duty cycle as shown by the circled letter "F" in FIG. 8. Furthermore, the 180° phase difference between the output clocks 19 and 22 is also in correct position as can be seen by the waveforms for clocks 19 and 22 in FIG. 8.

Figure 9:
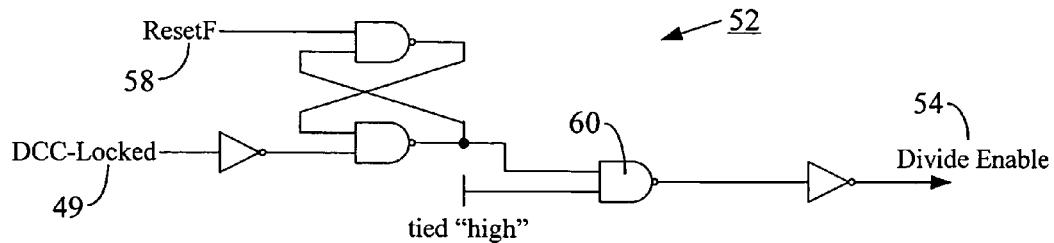
FIG. 9 illustrates an exemplary circuit configuration for the enable circuit in the 50% DCC of FIG. 6 according to one embodiment of the present disclosure.

FIG. 9 illustrates an exemplary circuit configuration for the enable unit 52 in the 50% DCC 45 of FIG. 6 according to one embodiment of the present disclosure. The enable circuit 52 is shown to receive the DCC-Locked signal 49 (from the phase detector 48 in FIG. 6) and also the complement of the system reset signal (ResetF 58) as inputs and generate the divide enable signal 54 using the circuit configuration of FIG. 9. During normal operation, the system reset signal (Reset) may remain in the logic "low" or "0" state, and, hence, the ResetF signal 58 may remain in the logic "1" or "high" state to enable operation of the circuit 52. One input of the NAND gate 60 is shown tied to a "high" voltage. In one embodiment, the other input of the NAND gate 60 may be connected to a programmable switch (not shown) which can be placed between the cross-coupled pair of NAND gates (receiving the ResetF 58 and DCC-Locked 49 inputs) and this second input of the NAND gate 60 to switch the signal applied to the NAND 60 gate's second input between a "high" voltage level and the signal output from the cross-coupled NAND gates. The switch may, thus, allow selection of whether to wait for coarse lock (in the DCC 45) before commencing the frequency division (by generating the divide enable signal 54). Such switch-based configuration may be helpful in case it is desired to always generate a pulse at the output of the XOR unit 50 during initialization of the DCC 45. Any other suitable logic configuration may be devised for the enable unit 52 to accomplish the teachings of the present disclosure. Additional logic circuits (not shown in FIG. 9) may be provided along with the enable unit 52 to accomplish various circuit design-related tasks. For example, a circuit (not shown) may be provided to allow DCC 45 to shift when the electronic device (e.g., a memory chip) (not shown) containing the DCC 45 is in a burn-in mode. Another circuit may be provided to freeze the DCC operation for a preset number of clock cycles during a DLL fine shift, thereby allowing DLL (e.g., the DLL 28 in the configuration of FIG. 2 with the DCC 26 replaced by the DCC 45 of FIG. 6) to have some control over the DCC frozen state.

Figure 10:
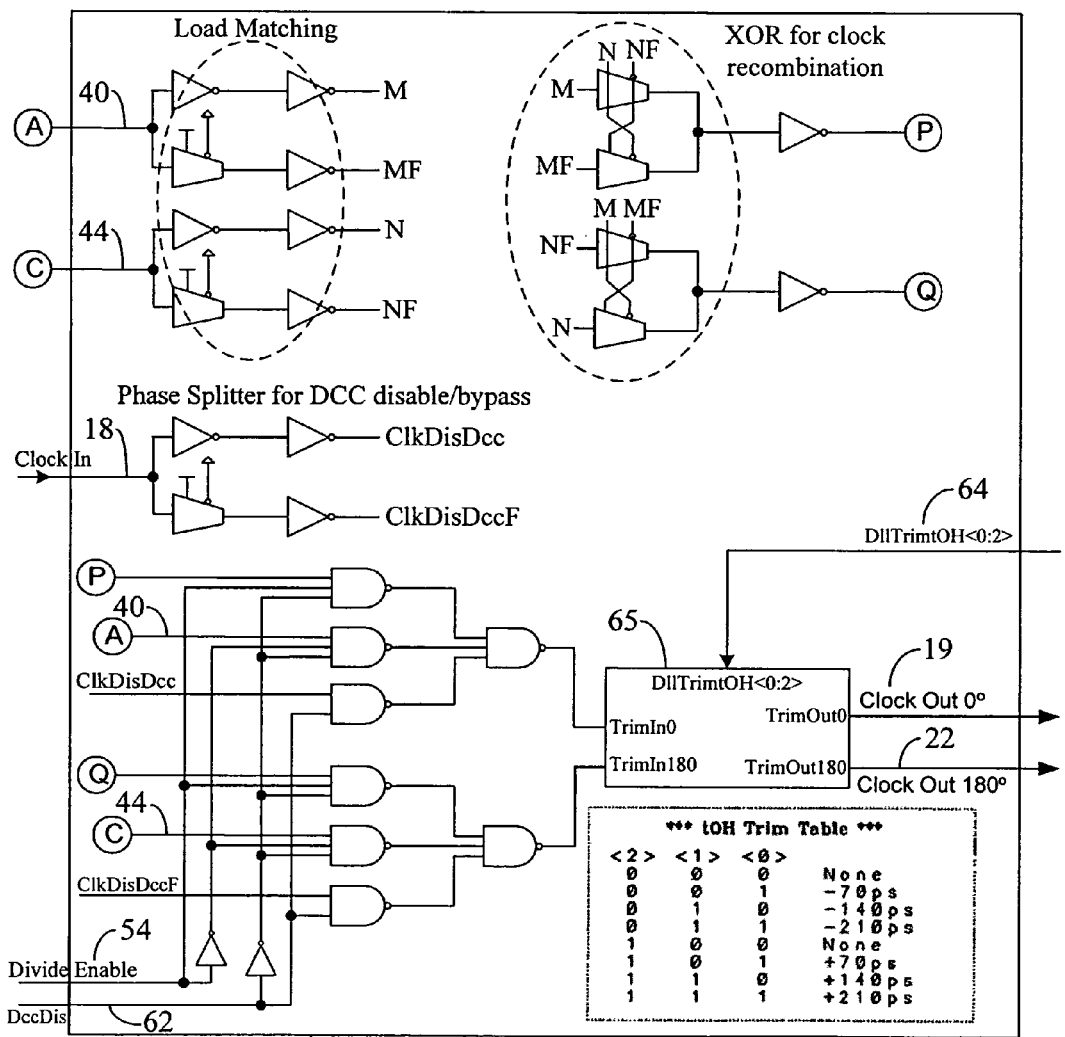
FIG. 10 depicts an exemplary circuit configuration for the edge detector unit in the 50% DCC of FIG. 6 according to one embodiment of the present disclosure.

FIG. 10 depicts an exemplary circuit configuration for the edge detector unit 50 in the 50% DCC 45 of FIG. 6 according to one embodiment of the present disclosure. In addition to the intermediate clock inputs 40, 44, and the divide enable input 54, the edge detector unit 50 in FIG. 10 is shown to receive three additional inputs including the input clock signal 18, a DccDis (DCC disable) signal 62, and a DllTrimtOH<0:2> input 64. Other internally generated signals and inputs in the circuit configuration of FIG. 10 are self-explanatory and, hence, are not discussed in detail herein for the sake of brevity. The usage of the divide enable signal 54 to control activation of the edge detection (clock multiplication or XOR) operation is shown by the circuit layout in FIG. 10. The load matching, clock recombination, and phase splitter sub-units in the edge detector 50 are also shown in FIG. 10. It is noted here that the DccDis signal 62 may be supplied by a DLL (not shown in FIG. 10) that may be operating in conjunction with the DCC 45 (as, for example, in the configuration of FIG. 2 with the DCC 26 in FIG. 2 replaced by the DCC 45 of FIG. 6) to allow the DLL to initialize and lock first before the DCC is allowed to lock. Once the DLL is locked, the DccDis signal may be de-asserted or placed in the logic "low" or "0" state. In an alternative embodiment, the DccDis signal 62 may be supplied by an external controller unit (e.g., a memory controller) (not shown) that controls the operation of the electronic device containing the DCC 45 in the configuration of FIG. 2. The three-bit signal DllTrimtOH<0:2> 64 (where tOH stands for "time Ouput High) may be an externally-supplied (e.g., by a DLL or by a controller unit (not shown)) DCC configuration signal that statically adjusts the falling edge signal (i.e., the Clock Out 180° signal 22) only to provide step-wise cumulative delay in the signal based on the status of the three-bits of the signal 64 as shown by the "tOH Trim Table" in FIG. 10. The "trimming" of the output clock 22 timings may be desirable to accurately maintain the 180° phase difference between output clocks 19, 22 during runtime or to test the alignments of clocks 19, 22 during testing of the circuit 50 in FIG. 10. The clock trimming operation may be accomplished using the trimming circuit 65 configured to implement the Trim Table shown in FIG. 10. The delay steps may be cumulative, with each step providing approximately 70 ps of timing adjustment. It is observed that because the Clock Out 180° signal 22 is not fed back to the DLL phase detector (as can be seen, for example, from the configuration of FIG. 2 wherein the DCC 26 may be replaced by the DCC 45 of FIG. 6), the timing adjustment provided by the trimming unit 65 may not affect the DLL feedback loop (through the I/O delay model 34 as shown, for example, in FIG. 2). In the embodiment of FIG. 10, the outputs of the trimming adjustment unit 65 are the Clock Out 0° signal 19 and the Clock Out 180° signal 22.

Figure 11:
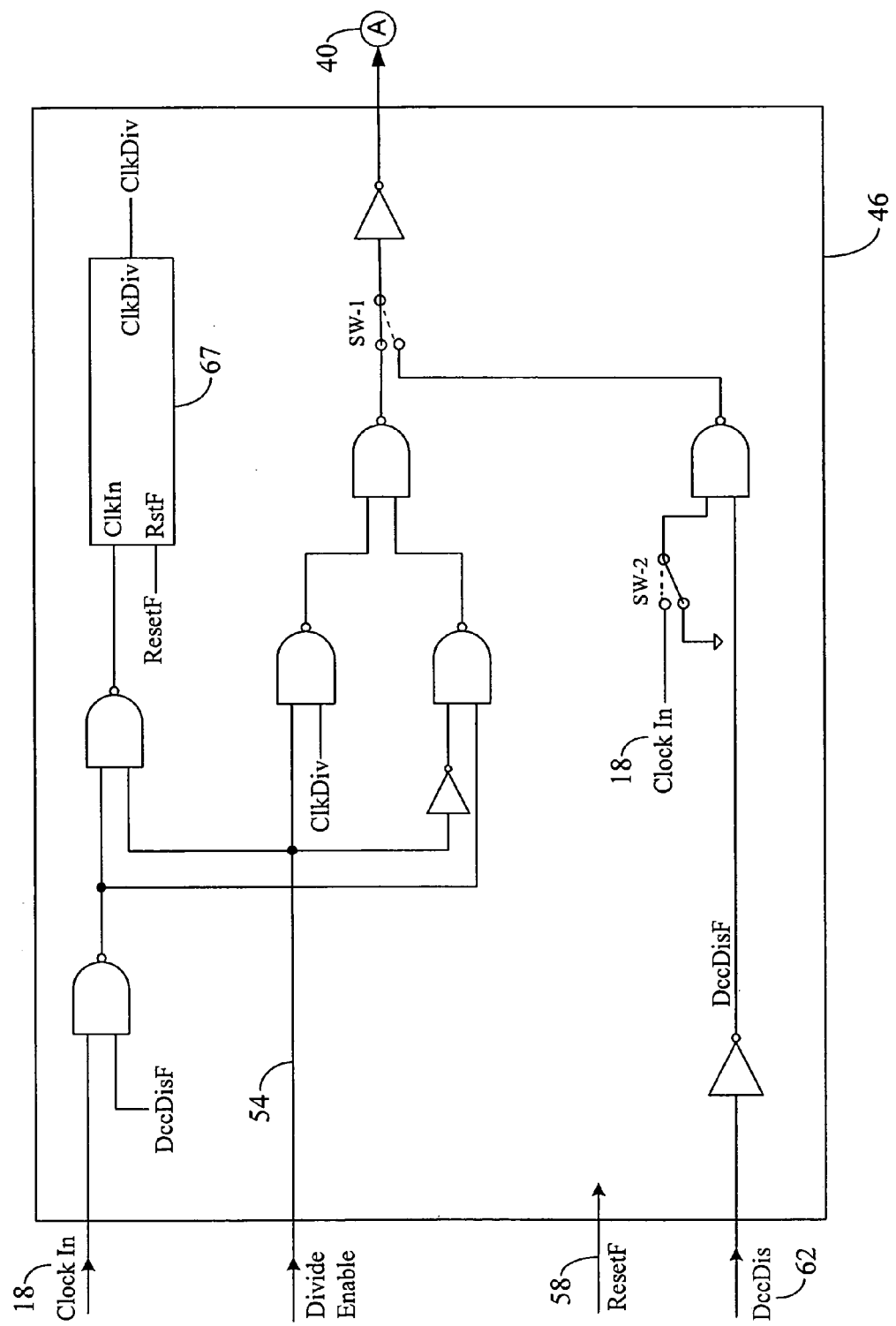
FIG. 11 shows an exemplary circuit configuration for the frequency divider unit in the 50% DCC of FIG. 6 according to one embodiment of the present disclosure.

FIG. 11 shows an exemplary circuit configuration for the frequency divider unit 46 in the 50% DCC 45 of FIG. 6 according to one embodiment of the present disclosure. The frequency divider 46 in FIG. 11 is shown to receive four input signals—the input clock 18, the divide enable signal 54, the complement of the system reset signal (ResetF) 58, and the DccDis (DCC disable) signal 62—and output the intermediate clock 40 which can be a frequency-divided version of the input clock 18 or a slightly-delayed version of the input clock 18 (due to the internal delay of the circuit 46) depending on whether the divide enable signal 54 is asserted or not (as can be seen from the exemplary waveforms in FIG. 7). The output (the ClkDiv signal in FIG. 11) of a clock-dividing unit 67 in the unit 46 may be supplied along with the divide enable signal 54 as inputs to a NAND gate. The divided version of the input clock 18 may be obtained at the output 40 when the divide enable signal 54 is asserted and the electronic switches (SW-1 and SW-2) in FIG. 11 are in the position shown. In the event that the divide enable signal 54 is not yet asserted, the positions of the switches may be changed as shown by the dotted lines to allow the input clock 18 to appear at the output 40 (without frequency division) depending on the status of the DccDis signal 62. If DCC 45 operation is to be disabled, then the DccDis signal 62 would be asserted "high" resulting in no clock signal at the intermediate clock output line 40. Additional operational details for the circuit 46 in FIG. 11 are self-explanatory and, hence, are not provided herein for the sake of brevity.

It is noted here that various circuit configurations in FIGS. 9-11 are given only as examples of the circuit designs for various constituent blocks in the DCC 45 of FIG. 6. It is evident to one skilled in the art that the circuit elements in the DCC 45 may be configured and designed in many different ways to accomplish the overall configuration shown in FIG. 6 according to one embodiment of the present disclosure. In other words, one skilled in the art can devise many different circuit configurations to implement the teachings of the present disclosure. Furthermore, as noted before, the 50% DCC 45 according to one embodiment of the present disclosure is one type of clock duty cycle corrector circuit that can be internal to any clock-operated integrated circuit or electronic device including, for example, an SDRAM memory unit. Further, although in the discussion given hereinbefore, the usage of the DCC 45 in FIG. 6 is discussed in conjunction with a DLL (e.g., with the DLL 28 in the circuit configuration of FIG. 2 with the DCC 26 replaced by the DCC 45), the 50% DCC 45 of the present disclosure may be used (with suitable modifications known to one skilled in the art) with any other synchronous/synchronization circuit including, for example, synchronous mirror delay (SMD) circuits or phase locked loop (PLL) circuits that may also be used for clock synchronization in various electronic integrated circuits including, for example, SDRAMs. The architecture of DCC 45 in FIG. 6 according to one embodiment of the present disclosure may be used to obtain a reduced-frequency, power-saving DCC that can be initialized without output glitches and without significant loss of clock time.

Figure 12:
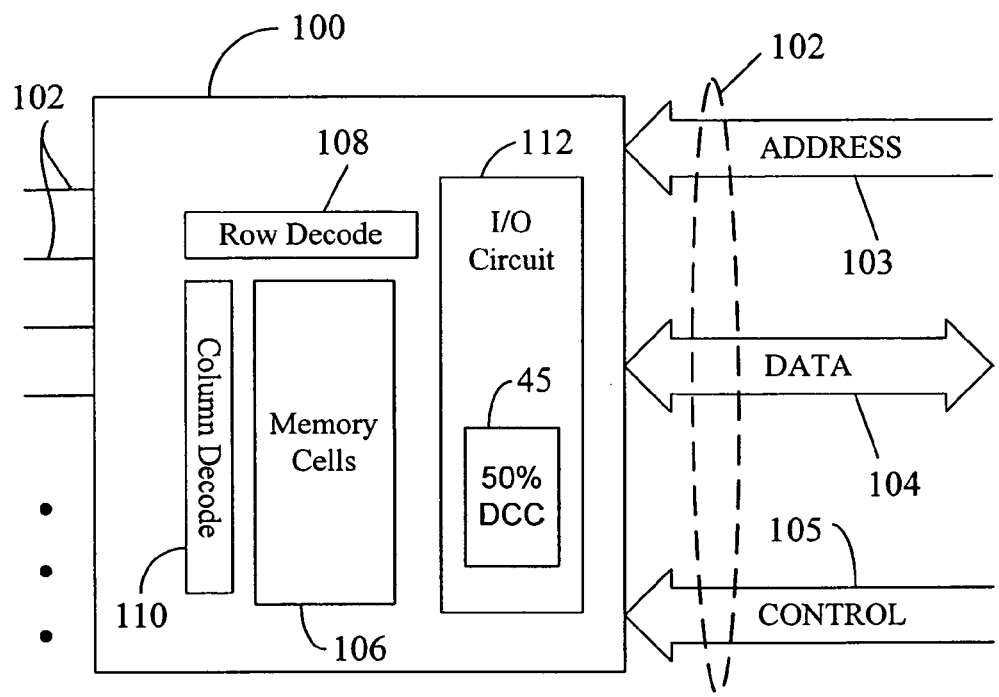
FIG. 12 is a simplified block diagram showing a memory device employing the 50% DCC of FIG. 6 according to one embodiment of the present disclosure.

FIG. 12 is a simplified block diagram showing a memory chip or memory device 100 employing the 50% duty cycle corrector (DCC) unit 45 of FIG. 6 according to one embodiment of the present disclosure. The memory chip 100 may be part of a DIMM (dual in-line memory module) or a PCB (printed circuit board) containing many such memory chips (not shown in FIG. 12). The memory chip 100 may include a plurality of pins 102 located outside of chip 100 for electrically connecting the chip 100 to other system devices. Some of those pins 102 may constitute memory address pins or address bus 103, data pins or data bus 104, and control pins or control bus 105. It is evident that each of the reference numerals 103-105 designates more than one pin in the corresponding bus. Further, it is understood that the schematic in FIG. 12 is for illustration only. That is, the pin arrangement or configuration in a typical memory chip may not be in the form shown in FIG. 12.

A processor or memory controller (not shown in FIG. 12, but shown in FIG. 13) may communicate with the chip 100 and perform memory read/write operations. The processor and the memory chip 100 may communicate using address signals on the address lines or address bus 103, data signals on the data lines or data bus 104, and control signals (e.g., a row address strobe (RAS) signal, a column address strobe (CAS) signal, etc. (not shown)) on the control lines or control bus 105. The "width" (i.e., number of pins) of address, data and control buses may differ from one memory configuration to another.

Those of ordinary skill in the art will readily recognize that memory chip 100 of FIG. 12 is simplified to illustrate one embodiment of a memory chip and is not intended to be a detailed illustration of all of the features of a typical memory chip. Numerous peripheral devices or circuits may be typically provided along with the memory chip 100 for writing data to and reading data from the memory cells 106. However, these peripheral devices or circuits are not shown in FIG. 12 for the sake of clarity.

The memory chip 100 may include a plurality of memory cells 106 generally arranged in rows and columns to store data in rows and columns. Each memory cell 106 may store a bit of data. A row decode circuit 108 and a column decode circuit 110 may select the rows and columns in the memory cells 106 in response to decoding an address, provided on the address bus 103. Data to/from the memory cells 106 is then transferred over the data bus 104 via sense amplifiers and a data output path (not shown). A memory controller (not shown) may provide relevant control signals (not shown) on the control bus 105 to control data communication to and from the memory chip 100 via an I/O (input/output) unit 112. The I/O unit 112 may include a number of data output buffers (not shown) to receive the data bits from the memory cells 106 and provide those data bits or data signals to the corresponding data lines in the data bus 104. The I/O unit 112 may further include a clock synchronization unit or delay locked loop (DLL) (e.g., the DLL 28 of FIG. 2) to synchronize the external system clock (e.g., the clock used by the memory controller (not shown) to clock address, data and control signals between the memory chip 100 and the controller) with the internal clock used by the memory 100 to perform data write/read operations on the memory cells 106. The I/O unit 112 may also include the 50% DCC 45 according to one embodiment of the present disclosure. The DCC 45 may operate in conjunction with the DLL in the I/O unit 112 in a configuration similar to the configuration shown in FIG. 2 (i.e., the DCC 26 in FIG. 2 replaced by the DCC 45 of FIG. 6) as discussed hereinbefore.

The memory controller (not shown) may determine the modes of operation of memory chip 100. Some examples of the input signals or control signals (not shown in FIG. 12) on the control bus 105 include an External Clock signal, a Chip Select signal, a Row Access Strobe signal, a Column Access Strobe signal, a Write Enable signal, etc. The memory chip 100 communicates to other devices connected thereto via the pins 102 on the chip 100. These pins, as mentioned before, may be connected to appropriate address, data and control lines to carry out data transfer (i.e., data transmission and reception) operations.

Figure 13:
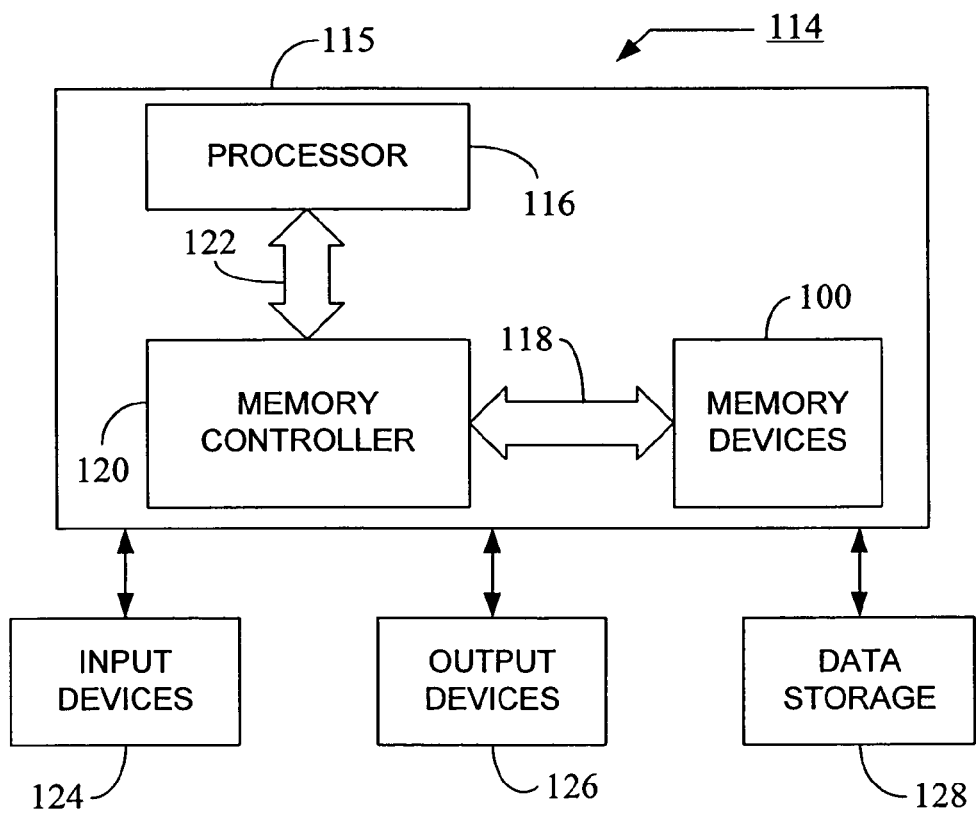
FIG. 13 is a block diagram depicting a system in which one or more memory chips having the architecture shown in FIG. 12 are used.

FIG. 13 is a block diagram depicting a system 114 in which one or more memory chips 100 having the architecture shown in FIG. 12 are used. The system 114 may include a data processing unit or computing unit 115 that includes a processor 116 for performing various computing functions, such as executing specific software to perform specific calculations or data processing tasks. The computing unit 115 may also include memory devices 100 that are in communication with the processor 116 through a bus 118. The bus 118 may include an address bus (not shown), a data bus (not shown), and a control bus (not shown). Each of the memory device 100 can be a dynamic random access memory (DRAM) chip or another type of memory circuits such as SRAM (Static Random Access Memory) chip or Flash memory. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that the memory device 100 of FIGS. 12 and 13 is simplified to illustrate one embodiment of a memory device and is not intended to be a detailed illustration of all of the features of a typical memory chip. The processor 116 can perform a plurality of functions based on information and data stored in the memory devices 100. The processor 116 can be a microprocessor, digital signal processor, embedded processor, micro-controller, dedicated memory test chip, or the like.

Each of the memory devices 100 may have construction similar to that shown in FIG. 12 (i.e., each memory device 100 may include the 50% DCC circuit 45 constructed according to the teachings of the present disclosure), and, hence, the same reference numeral "100" is used in FIGS. 12 and 13 to refer to these memory devices. A memory controller 120 controls data communication to and from the memory devices 100 in response to control signals (not shown) received from the processor 116 over the bus 122. The memory controller 120 may include a command decode circuit (not shown). The command decode circuit may receive the input control signals (on the bus 122) (not shown) to determine the modes of operation of one or more of the memory devices 100. Some examples of the input signals or control signals (not shown in FIG. 13) on the bus 122 (and also on the bus 118) include an External Clock signal, a Chip Select signal, a Row Access Strobe signal, a Column Access Strobe signal, a Write Enable signal, etc.

The system 114 may include one or more input devices 124 (e.g., a keyboard, a mouse, etc.) connected to the computing unit 115 to allow a user to manually input data, instructions, etc., to operate the computing unit 115. One or more output devices 126 connected to the computing unit 115 may also be provided as part of the system 114 to display or otherwise output data generated by the processor 116. Examples of output devices 126 include printers, video terminals or video display units (VDUs). In one embodiment, the system 114 also includes one or more data storage devices 128 connected to the data processing unit 115 to allow the processor 116 to store data in or retrieve data from internal or external storage media (not shown). Examples of typical data storage devices 128 include drives that accept hard and floppy disks, CD-ROMs (compact disk read-only memories), and tape cassettes.

The foregoing describes a reduced-frequency, 50% duty cycle corrector (DCC) circuit that may be used in an electronic device (e.g., a memory chip) to generate output clocks with 50% duty cycle irrespective of the duty cycle of the clock input to the DCC circuit. A DCC initialization scheme according to one embodiment of the present disclosure selectively activates the frequency division and edge detection operations in the DCC based on the lock status of the DCC during initialization. Upon initialization, the frequency division and edge detection operations are turned off or disabled. After the DCC is properly locked, these operations are enabled to obtain the 50% duty cycle output clock. This approach initializes the reduced-frequency DCC without output glitches, which can affect locking of a DLL with which the DCC may be used. The prevention of instability in locking of the DCC and DLL upon system initialization results in swift establishment of DCC and DLL locks without significant power consumption or loss of clock cycles. Once the DCC is locked during its initialization, the reduced-frequency operation of DCC further saves current consumption.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of operating a clock duty cycle corrector (DCC), comprising:
   receiving an input clock;
   generating an output clock having a first duty cycle from said input clock upon commencement of an initialization of said DCC, wherein said first duty cycle is identical to the duty cycle of said input clock; and
   switching the duty cycle of said output clock from said first duty cycle to a second duty cycle once said DCC is locked during said initialization, wherein said second duty cycle is different from said first duty cycle.

2. The method of claim 1, wherein said second duty cycle has a predetermined value different from said first duty cycle.

3. The method of claim 2, wherein said predetermined value is 50%.

4. The method of claim 1, wherein said generating includes:
   generating said output clock having said first duty cycle by disabling clock frequency division and clock edge detection operations in said DCC upon commencement of said Initialization.

5. The method of claim 4, wherein said switching includes:
   enabling said clock frequency division and clock edge detection operations in said DCC once said DCC is locked during said initialization so as to switch the duty cycle of said output clock from said first duty cycle to said second duty cycle.

6. The method of claim 1, further comprising:
   inputting said input clock and a first clock signal derived from said input clock to a phase detector in said DCC upon commencement of said initialization of said DCC;
   configuring said phase detector to lock a rising edge of said first clock signal with a rising edge of said input clock signal upon commencement of said initialization;
   inputting a second clock signal derived from said input clock and a third clock signal derived from said second clock signal to said phase detector once said DCC is locked during said initialization; and
   enabling said phase detector to lock a rising edge of said third clock signal with a falling edge of said second clock signal once said DCC is locked during said initialization.

7. The method of claim 6, wherein said first clock signal is a time-delayed version of said input clock having a duty cycle identical to the duty cycle of said input clock, wherein said second clock signal is a frequency-divided version of said input clock having a duty cycle different from the duty cycle of said input clock, and wherein said third clock signal is a time-delayed version of said second clock signal having a duty cycle identical to the duty cycle of said second clock signal.

8. The method of claim 1, wherein either said output clock with said second duty cycle is in phase with said input clock or said output clock with said second duty cycle is 180° out of phase with said input clock.

9. The method of claim 1, wherein said receiving includes receiving said input clock as an input to a clock frequency divider circuit in said DCC, and wherein said method further comprises:
   supplying an output of said clock frequency divider circuit as an input to a first delay line in said DCC and also as a first input to a clock edge detector in said DCC;
   supplying an output of said first delay line as a second input to said clock edge detector; and
   configuring said clock edge detector to generate said output clock with said first and said second duty cycles from said first and said second inputs thereto.

10. The method of claim 9, wherein generating said output clock with said first duty cycle includes:
    disabling a frequency division operation in said clock frequency divider and an edge detection operation in said clock edge detector to generate said output clock with said first duty cycle;
    and wherein said switching includes:
    enabling said frequency division operation in said clock frequency divider and said edge detection operation in said clock edge detector once said DCC is locked during said initialization so as to switch the duty cycle of said output clock from said first duty cycle to said second duty cycle.

11. The method of claim 10, further comprising:
    supplying said output of said clock frequency divider circuit as a first input to a phase detector in said DCC;
    supplying an output of a second delay line connected in series with said first delay line in said DCC as a second input to said phase detector;
    configuring said phase detector to assert a lock indicator signal at its output when said first and said second inputs thereto are phase locked;
    wherein said disabling includes:
    disabling said frequency division operation in said clock frequency divider and said edge detection operation in said clock edge detector when said lock indicator signal is de-asserted; and
    wherein said enabling includes:
    enabling said frequency division operation in said clock frequency divider and said edge detection operation in said clock edge detector when said lock indicator signal is asserted.

12. The method of claim 11, further comprising:
    configuring said phase detector to lock a rising edge of said first input with a rising edge of said second input when said lock indicator signal is de-asserted; and
    configuring said phase detector to lock a falling edge of said first input with a rising edge of said second input when said lock indicator signal is asserted.

13. In a clock duty cycle corrector (DCC) having a frequency divider to divide the frequency of an input clock to said DCC, a delay line to generate a delayed version of said input clock, and an edge detector operating on said delayed version of said input clock and an output of said frequency divider to generate an output clock from said DCC, the improvement comprising selectively enabling operations of said frequency divider and said edge detector based on a lock status of said DCC.

14. In the DCC of claim 13, said improvement comprising:
   disabling operations of said frequency divider and said edge detector until said DCC is locked during said initialization thereof; and
   enabling operations of said frequency divider and said edge detector once said DCC is locked during said initialization thereof.

15. A method of operating a clock duty cycle corrector (DCC), comprising:
   receiving an input clock having a fixed duty cycle;
   generating an output clock having a duty cycle identical to the duty cycle of said input clock until said DCC is locked; and
   switching the duty cycle of said output clock to a duty cycle different from the duty cycle of said input clock once said DCC is locked.

16. The method of claim 15, further comprising:
   monitoring a lock status of said DCC; and
   asserting a DCC-locked signal when said DCC is locked during said initialization thereof.

17. The method of claim 16, wherein said generating includes:
   generating said output clock having said duty cycle identical to the duty cycle of said input clock so long as said DCC-locked signal is de-asserted;
   and wherein said switching includes:
   switching the duty cycle of said output clock when said DCC-locked signal is asserted.

18. The method of claim 15, wherein said switching includes switching the duty cycle of said output clock to a 50% duty cycle once said DCC is locked during said initialization.

19. A method of operating a clock duty cycle corrector (DCC) comprising:
   receiving an input clock;
   monitoring a lock status of said DCC; and
   performing one of the following based on said lock status of said DCC:
      generating an output clock having a duty cycle identical to the duty cycle of said input clock until said DCC is locked, and
      generating said output clock having a duty cycle different from the duty cycle of said input clock once said DCC is locked.

20. A method, comprising:
   generating an output clock from an input clock and having a first duty cycle identical to the duty cycle of said input clock prior to occurrence of a triggering event; and
   switching the duty cycle of said output clock from said first duty cycle to a second duty cycle different from the first duty cycle upon occurrence of said triggering event.

21. The method of claim 20, wherein said triggering event includes locking of a clock duty cycle corrector (DCC) unit receiving said input clock and operating thereon to generate said output clock therefrom.

22. A circuit, comprising:
   a frequency divider unit for receiving an input clock and for generating a first intermediate clock therefrom;
   a phase detector unit, coupled to said frequency divider unit, for receiving said first intermediate clock and a second intermediate clock and for asserting a lock signal based on a relationship between the phases thereof; and
   a divide enable unit coupled between said phase detector and said frequency divider units for receiving said lock signal from said phase detector and for asserting an enable signal at an output thereof when said lock signal is asserted,
   said frequency divider unit being configured for receiving said enable signal and for turning on when said enable signal is asserted and for turning off when said enable signal is de-asserted.

23. The circuit of claim 22, wherein the frequency of said first intermediate clock is less than the frequency of said input clock and a duty cycle of said first intermediate clock is different from the duty cycle of said input clock when said frequency divider unit is turned on, and wherein the frequency and duty cycle of said first intermediate clock are identical to the frequency and duty cycle of said input clock when said frequency divider unit is turned off.

24. The circuit of claim 22, further comprising:
   a delay unit coupled to said frequency divider unit and to said phase detector unit for receiving said first intermediate clock and for generating said second intermediate clock at an output thereof, wherein said second intermediate clock is a time-delayed version of said first intermediate clock.

25. The circuit of claim 24, wherein said delay unit includes:
   a first delay line connected in series with said frequency divider unit for receiving said first intermediate clock and for generating a first delayed version thereof; and
   a second delay line, connected in series with said first delay line and coupled to said phase detector unit, for receiving said first delayed version of said first intermediate clock and for generating a second delayed version of said first intermediate clock, wherein said second delayed version is said second intermediate clock.

26. The circuit of claim 25, further comprising:
   an edge detector unit coupled to said frequency divider unit, said enable circuit, and said first delay line for receiving said first intermediate clock and said first delayed version of said first intermediate clock and for generating an output clock therefrom which may be a time delayed version of said input clock or a duty-cycle corrected version of said input clock.

27. The circuit of claim 26, wherein the duty cycle of said duty-cycle corrected version of said input clock is 50%.

28. The circuit of claim 22, wherein said phase detector unit is for receiving said enable signal and for locking a rising edge of said first intermediate clock with a rising edge of said second intermediate clock when said enable signal is de-asserted and for locking a falling edge of said first intermediate clock with a rising edge of said second intermediate clock when said enable signal is asserted.

29. A memory device, comprising:
   a plurality of memory cells; and
   a plurality of peripheral devices for reading data from said plurality of memory cells, said peripheral devices comprising:
      a clock synchronization circuit for receiving an external clock and for generating an input clock therefrom, wherein said input clock is a phase synchronized version of said external clock; and
      a duty cycle corrector (DCC) unit in series with said clock synchronization circuit for receiving said input clock and for generating an output clock therefrom, wherein said output clock is a duty-cycle corrected version of said input clock, said DCC unit comprising:
         a frequency divider unit for receiving said input clock and for generating a first intermediate clock therefrom;
         a first delay line coupled to said frequency divider unit for receiving said first intermediate clock and for generating a time-delayed version of said first intermediate clock at an output thereof; and an edge detector unit, coupled to said frequency divider unit and said delay unit, for generating said output clock, wherein activation of said frequency divider unit and said edge detector unit is based on a lock status of said DCC.

30. The memory device of claim 29, wherein the frequency of said first intermediate clock is less than the frequency of said input clock and a duty cycle of said first intermediate clock is different from the duty cycle of said input clock when said frequency divider unit is turned on, and wherein the frequency and duty cycle of said first intermediate clock are identical to the frequency and duty cycle of said input clock when said frequency divider unit is turned off.

31. The memory device of claim 30, wherein the duty cycle of said duty-cycle corrected version of said input clock is 50%.

32. The memory device of claim 29, further comprising:
a second delay line connected in series with said first delay line for receiving said time-delayed version of said first intermediate clock and for generating a second intermediate clock at an output thereof;
a phase detector unit coupled to said frequency divider unit and said second delay line for receiving said first intermediate clock and said second intermediate clock and for asserting a lock signal based on a relationship between the phases of said first and said second intermediate clocks; and
a divide enable unit coupled to said phase detector and said frequency divider units for receiving said lock signal from said phase detector and for asserting an enable signal at an output thereof when said lock signal is asserted.

33. The memory device of claim 32, wherein said frequency divider unit is for receiving said enable signal and is configured to be turned on when said enable signal is asserted and to be turned off when said enable signal is de-asserted, and wherein said edge detector unit is for receiving said enable signal and is configured to be turned on when said enable signal is asserted and turned off when said enable signal is de-asserted.

34. The memory device of claim 32, wherein said phase detector unit is for receiving said enable signal and for locking a rising edge of said first intermediate clock with a rising edge of said second intermediate clock when said enable signal is de-asserted and for locking a falling edge of said first intermediate clock with a rising edge of said second intermediate clock when said enable signal is asserted.

35. A system, comprising:
a processor;
a bus; and
a memory device coupled to said processor via said bus, wherein said memory device comprises a plurality of memory cells and a plurality of peripheral devices for reading data from said plurality of memory cells, said peripheral devices comprising:
a clock synchronization circuit for receiving an external clock and for generating an input clock therefrom, wherein said input clock is a phase synchronized version of said external clock; and
a duty cycle corrector (DCC) unit in series with said clock synchronization circuit for receiving said input clock and for generating an output clock therefrom, wherein said output clock is a duty-cycle corrected version of said input clock, said DCC unit comprising:

a frequency divider unit for receiving said input clock and for generating a first intermediate clock therefrom;
a first delay line coupled to said frequency divider unit for receiving said first intermediate clock and for generating a time-delayed version of said first intermediate clock at an output thereof; and
an edge detector unit, coupled to said frequency divider unit and said delay unit, for generating said output clock,
wherein activation of said frequency divider unit and said edge detector unit is based on a lock status of said DCC.

36. The system of claim 35, wherein the frequency of said first intermediate clock is less than the frequency of said input clock and a duty cycle of said first intermediate clock is different from the duty cycle of said input clock when said frequency divider unit is turned on, and wherein the frequency and duty cycle of said first intermediate clock are identical to the frequency and duty cycle of said input clock when said frequency divider unit is turned off.

37. The system of claim 36, wherein the duty cycle of said duty-cycle corrected version of said input clock is 50%.

38. The system of claim 35, further comprising:
a second delay line connected in series with said first delay line for receiving said time-delayed version of said first intermediate clock and for generating a second intermediate clock at an output thereof;
a phase detector unit coupled to said frequency divider unit and said second delay line for receiving said first intermediate clock and said second intermediate clock and for asserting a lock signal based on a relationship between the phases of said first and said second intermediate clocks; and
a divide enable unit coupled to said phase detector and said frequency divider units for receiving said lock signal from said phase detector and for asserting an enable signal at an output thereof when said lock signal is asserted.

39. The system of claim 38, wherein said frequency divider unit is for receiving said enable signal and is configured to be turned on when said enable signal is asserted and to be turned off when said enable signal is de-asserted, and wherein said edge detector unit is for receiving said enable signal and is configured to be turned on when said enable signal is asserted and turned off when said enable signal is de-asserted.

40. The system of claim 38, wherein said phase detector unit is for receiving said enable signal and for locking a rising edge of said first intermediate clock with a rising edge of said second intermediate clock when said enable signal is de-asserted and for locking a falling edge of said first intermediate clock with a rising edge of said second intermediate clock when said enable signal is asserted.

41. A system, comprising:
means for generating an output clock from an input clock and having a first duty cycle identical to the duty cycle of said input clock prior to occurrence of a triggering event; and
means for switching the duty cycle of said output clock from said first duty cycle to a second duty cycle different from the first duty cycle upon occurrence of said triggering event.

42. The system of claim 41, wherein said triggering event includes establishment of a phase locked status between a first clock derived from said input clock and a second clock related to said output clock.

* * * * *